United States Patent
Ota et al.

(10) Patent No.: US 7,318,322 B2
(45) Date of Patent: Jan. 15, 2008

(54) LIQUID COOLING SYSTEM FOR A RACK-MOUNT SERVER SYSTEM

(75) Inventors: Shigemi Ota, Fujisawa (JP); Shinji Matsushita, Chigasaki (JP)

(73) Assignee: Hitachi, Ltd., Tokyo (JP)

( * ) Notice: Subject to any disclaimer, the term of this patent is extended or adjusted under 35 U.S.C. 154(b) by 246 days.

(21) Appl. No.: 10/776,231

(22) Filed: Feb. 12, 2004

(65) Prior Publication Data

US 2004/0221604 A1    Nov. 11, 2004

(30) Foreign Application Priority Data

Feb. 14, 2003 (JP) ............................. 2003-036255

(51) Int. Cl.
  *F25D 23/12* (2006.01)
(52) U.S. Cl. ....................... 62/259.2; 62/305
(58) Field of Classification Search ............. 62/259.2, 62/3.3, 305; 361/702, 691; 165/80.3
See application file for complete search history.

(56) References Cited

U.S. PATENT DOCUMENTS 6,473,297 B1 * 10/2002 Behl et al. ................. 361/685
6,525,937 B2 * 2/2003 Yanagida ................... 361/695
6,657,121 B2 * 12/2003 Garner ...................... 174/16.3
2002/0124585 A1   9/2002 Bash et al.

FOREIGN PATENT DOCUMENTS

| DE | 2651015 | 5/1978 |
| EP | 0231456 A1 | 11/1986 |
| JP | 2000-261172 | 9/2000 |
| JP | 2002374086 | 12/2002 |

* cited by examiner

*Primary Examiner*—Melvin Jones
(74) *Attorney, Agent, or Firm*—Mattingly, Stanger, Malur & Brundidge, PC

(57) ABSTRACT

A rack-mount server system of a liquid cooling system, in which a heat-generating component such as a CPU is cooled by a coolant has a plurality of server modules with heat-generating components which are cooled by the circulating coolant. The server modules are connected in parallel to a circulation coolant path through which the coolant to cool the server modules is circulated. In the middle of the coolant circulation path is a cooling unit that cools the coolant by radiating its heat to the outside air. Furthermore, a bypass route parallel to the server modules and going around the server modules is provided in the coolant circulation path, and the circulation quantity of the coolant is controlled in the bypass route. Alternatively, the flow quantity of the coolant is controlled in each of the server modules.

28 Claims, 12 Drawing Sheets

LIQUID COOLING SYSTEM FOR A RACK-MOUNT SERVER SYSTEM

BACKGROUND OF THE INVENTION

The present invention relates to a cooling method for a rack-mount server system in which a plurality of computers are stacked. More particularly, the present invention relates to a technique effectively applied to the liquid cooling system in which a coolant is circulated.

In recent years, the rack-mount system has been the mainstream in the system configuration, storage, and installation of a data processing system such as a server. In the rack-mount system, the devices with specific functions are mounted so that they are stacked on each other in a rack cabinet formed based on a particular standard, and the rack-mount system has the advantages as follows: the devices can be freely selected and arranged, the rack-mount server system is excellent in the flexibility and extensibility of the system configuration, and the space occupied by the system can be reduced.

Particularly, the 19 inch rack cabinet defined in the IEC standard (International Electrical Commission)/EIA standard (The Electrical Industries Association) has been the mainstream of the server system, in which the horizontal width between the posts to mount the devices is defined as 451 mm and the height for mounting the devices is defined as 1U (1 EIA=44.45 mm).

Note that FIG. 15 is a perspective view showing the state where the server modules are mounted in the rack cabinet of the conventional rack-mount server system, which is examined as a background of the present invention by the inventors. In the conventional rack-mount server system, a plurality of server modules are mounted in the rack cabinet 10. The rack cabinet 10 is composed of four posts to be the outer frame and four mount angles 11 on which the server modules are mounted.

The device housing 1 of the server module is attached to the mount angles 11 via metal brackets 8. A main substrate 2 is mounted in the device housing 1, and heat-generating components 3 such as CPU (Central Processing Unit) and LSI (Large Scale Integrated circuit) are mounted on the main substrate 2. A heat radiation fin 4 is attached on each of the heat-generating components 3, and cooling fans 5 are mounted on the upstream side or the downstream side of the radiation fins 4 to deliver the air to the radiation fins 4.

Usually, devices 6 such as magnetic storage devices are mounted on the front face of the server module and connectors 7 to the outside are mounted on the rear face of the server module.

In the configuration described above, the outside air is taken by the cooling fans 5 mounted in the device housing 1 from the front face of the devices through the spaces between the devices 6, and after cooling the heat-generating components 3 by the heat radiation fin 4, the air is exhausted through the spaces between the connectors 7 to the rear face or the side faces of the device.

The conventional rack-mount server system mainly employs the forced air cooling system as described above in which the air is taken from the front face of the device by the cooling fan 5 mounted in the device housing 1 of the server module and the air is exhausted to the rear face or the side faces of the device after cooling the heat-generating components 3. Note that the technique relating to the forced air cooling system for the rack-mount system is disclosed in Japanese Patent Laid-Open No. 2000-261172.

SUMMARY OF THE INVENTION

Meanwhile, in the rack-mount system as described above, other devices are similarly mounted above and below the devices of the server module. Therefore, even in the case where the air is taken in and out through the top and bottom plates, the intake and exhaust vents are obstructed and thus it is impossible to achieve the desired cooling effects. Furthermore, in the case where the intake vents are provided on the side face of the devices, the air heated by the exhausted air from the devices is taken in and the cooling efficiency is reduced. Therefore, in the forced air cooling system for the rack-mount system, it is necessary that the air is taken in from the front face of the devices and exhausted from the rear face or the side faces.

Also, in the rack-mount system, the reduction in thickness of the devices has advanced in recent years so as to achieve the higher density mounting and the space saving of the server modules in the rack cabinet, and the cooling fan mounted in the device is limited to the small cooling fan with a small flow rate. In addition, since devices such as magnetic storage devices are mounted on the front face of the devices and connectors to the outside are arranged on the rear face of the devices, the area for the air intake and exhaust is significantly reduced.

Also, with the performance development of the server module in the rack-mount system, the performance of CPU or LSI is enhanced, the multiple CPU configuration is increasingly used, and devices such as the magnetic storage devices are operated at higher speed and formed into an array. As a result, the amount of heat generated therein is increased. Therefore, it becomes more and more difficult to ensure the air flow rate required in the forced air cooling.

Accordingly, an object of the present invention is to provide the cooling method capable of achieving the cooling enough to ensure the reliability of the server modules mounted in the rack cabinet without losing the advantages of the rack-mount system and capable of achieving the smooth radiation of the heat from the high-temperature components mounted on the server module particularly by adopting the liquid cooling system even in the case where the performance of the server module is advanced, the thickness the server module is reduced, and the high density mounting technology is advanced.

For the achievement of the object described above, the present invention provides the configuration including a plurality of rack-mounted server modules having heat-generating components, a cooling unit for radiating heat to the outside, and a coolant circulation path which connects the plurality of server modules to the cooling unit and through which the coolant is circulated, wherein the plurality of server modules are connected to the coolant circulation path in parallel to each other. In this configuration, the liquid cooling system is used as the cooling system of the server modules, wherein the coolant thereof is supplied to each of the devices of the server modules through the coolant circulation path, the coolant drained from each of the devices is transferred to the outside of the devices, and the coolant is cooled in the cooling unit mounted in the rack cabinet and then supplied again to each of the devices of the server modules.

In the liquid cooling system, the pipe serving as the coolant circulation path to circulate the coolant through the rack cabinet is arranged vertically along the post of the rack cabinet, and the pump functioning as coolant circulation means and the cooling section for cooling the coolant by using an heat exchanger are provided as the cooling unit on the upper side or the lower side of the rack cabinet. Also, the downstream side of the coolant circulation path from the cooling unit is defined as the downstream pipe and the upstream side of the coolant circulation path from the cooling unit is defined as the upstream pipe, and the upstream pipe and the downstream pipe are vertically formed in parallel to each other, and also, the cooled coolant is constantly supplied to the downstream pipe. In this manner, the closed circulation path is formed within the rack cabinet.

In the server module, a supply port to supply the coolant from outside is formed and the supply port is connected to the internal pipe which is the coolant circulation path inside the device. Also, the internal pipe is extended to heat-generating components such as CPU and LSI. In addition, heat receivers to receive the heat and a drain port to drain the heated coolant to the outside are provided in the server module, and the coolant is transferred by a pump serving as the circulation means incorporated in the device.

Also, in the server module, the downstream pipe and the upstream pipe are respectively connected to the supply port and the drain port, through which the coolant is circulated. In this manner, the cooled coolant is constantly supplied and a great amount of heat is radiated to the outside of the devices, and thus, the heat-generating components with a relatively high temperature of each of the devices in the server module are cooled.

Furthermore, in the server module, the hybrid configuration of the liquid cooling and the air cooling is also available in which the liquid cooling system is used to cool the heat-generating components with a high temperature and the air cooling system is used to cool the heat-generating components with a relatively low temperature. Furthermore, when there are a plurality of heat-generating components with a high temperature, the pipes to circulate the coolant are connected in parallel to each other.

In addition, in order to facilitate the connection and disconnection of the coolant pipe at the time of mounting and detaching the server module to and from the rack cabinet, the joints with automatic valve are used to connect the pipes on the rack cabinet side to the supply ports on the side of the device of the server module.

Furthermore, joints as the supply ports and the drain ports are provided and many pairs of the supply port and the drain port are arranged vertically on the downstream pipe and the upstream pipe so that a plurality of server modules can be positioned at any desired positions.

Also, in order to prevent the variation in flow quantity and ensure the stable cooling performance even in the case where a plurality of server modules are connected to the pipes provided on the rack cabinet side, a pump is incorporated in each of the devices of the server modules so that they can supply and drain the coolant from and to the pipes on the rack cabinet side by itself.

In addition, in this cooling system, in order to provide the stable cooling performance, the function to detect the temperature of the circulating coolant and control the power of the heat exchanger is given to the cooling unit using the heat exchanger, and thus, the temperature of the coolant passing through the cooling unit can be kept at a constant temperature.

Also, in order to enhance the introduction of the cooling system for the rack-mount server system according to the present invention, the configuration of the present invention is provided as the rack cabinet in which the pump, the heat exchanger, the cooling unit, the pipes, and the like constituting the liquid cooling system are incorporated.

Also, in order to provide the redundancy configuration of the cooling system for the rack-mount server system, a plurality of devices operated independently are mounted in the cooling unit, and when a device does not work well, the other device is operated.

In this specification, a rack-mount server system in which a plurality of server modules having a CPU are mounted is disclosed. However, the present invention is not limited to the server module and it is possible to apply the present invention to the HDD module having heat-generating components with a high temperature and also to a network module.

DESCRIPTION OF THE PREFERRED EMBODIMENTS

Hereinafter, embodiments of the present invention will be described in detail with reference to the accompanying drawings. Note that components having the same function are denoted by the same reference symbols throughout the drawings for describing the embodiments, and the repetitive description thereof is omitted.

Figure 1:
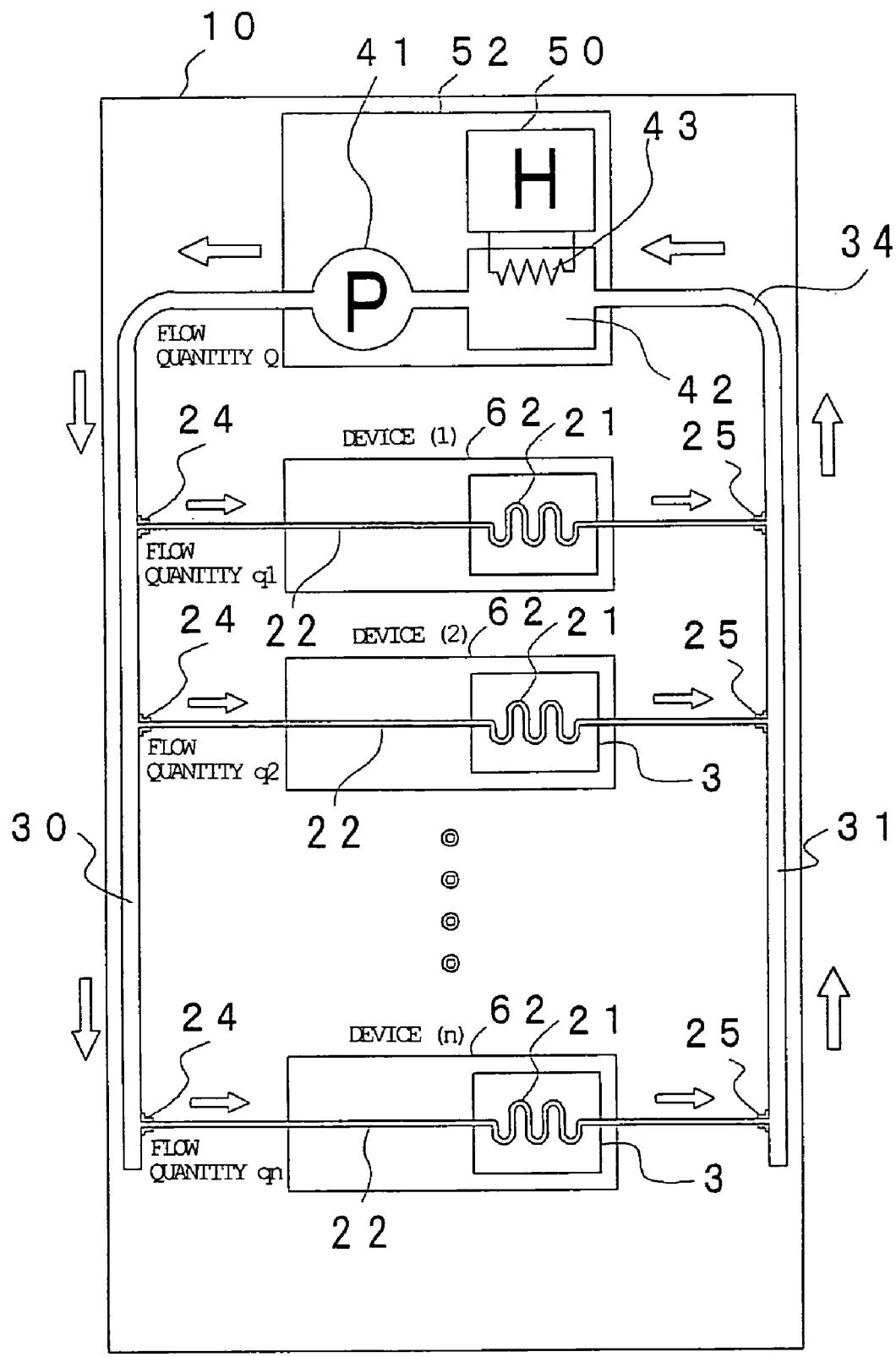
FIG. 1 is a schematic block diagram showing the system in which a bypass route is not provided.
Figure 2:
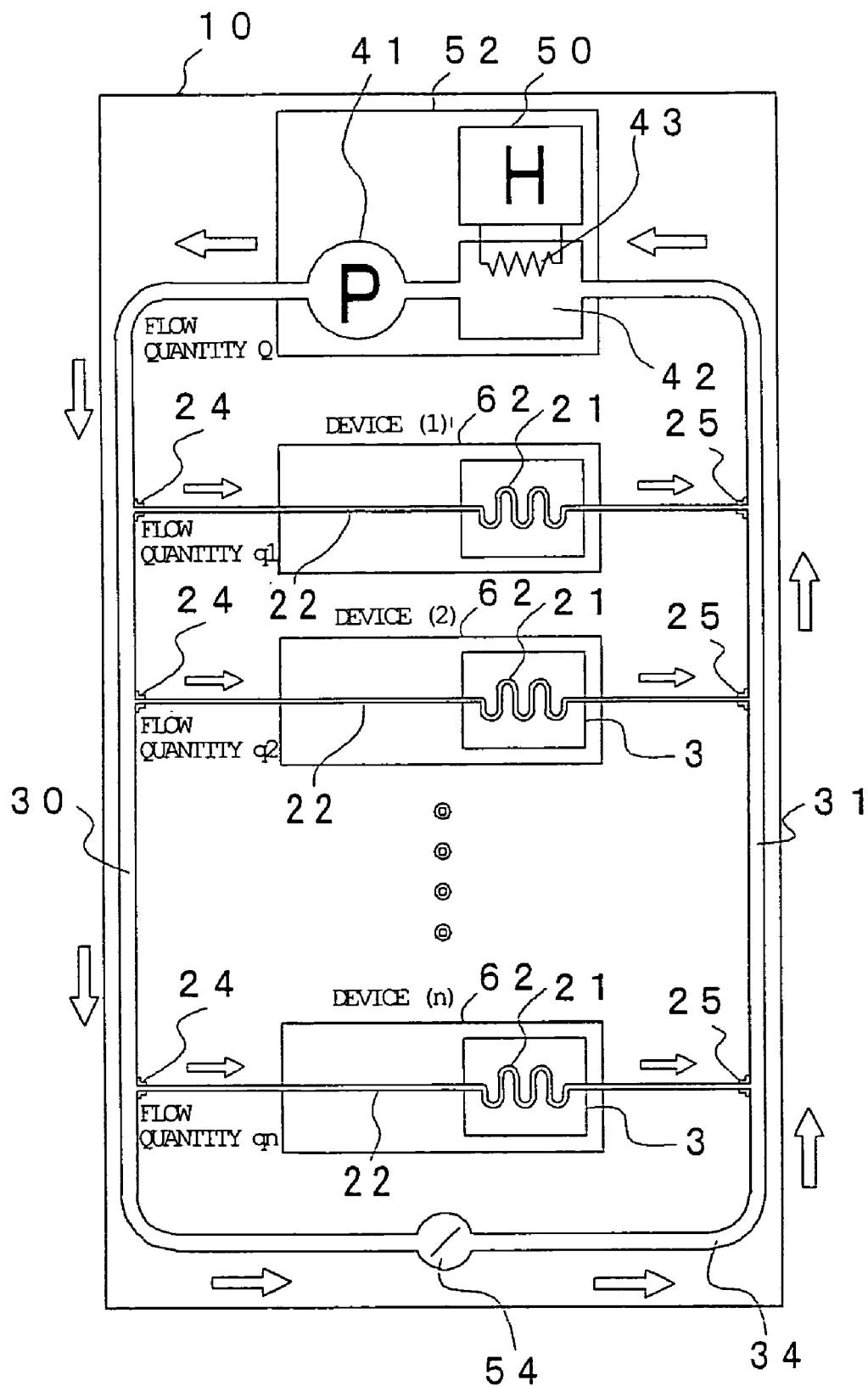
FIG. 2 is a schematic block diagram showing the system in which a bypass route is provided and a pump is not mounted on each of the devices of the server modules.
Figure 3:
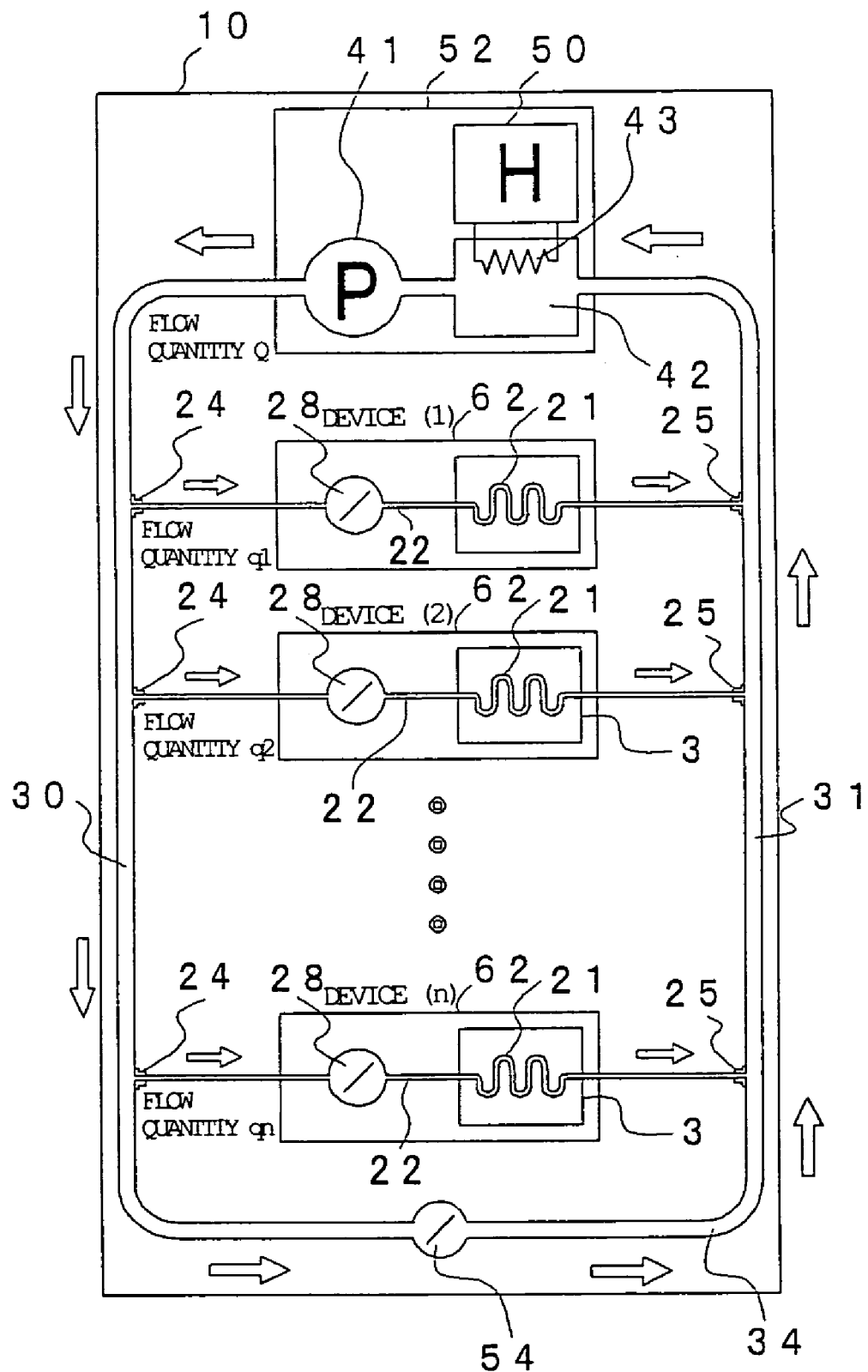
FIG. 3 is a schematic block diagram showing the system in which a bypass route is provided and a flow control valve is provided in each of the devices of the server modules.
Figure 4:
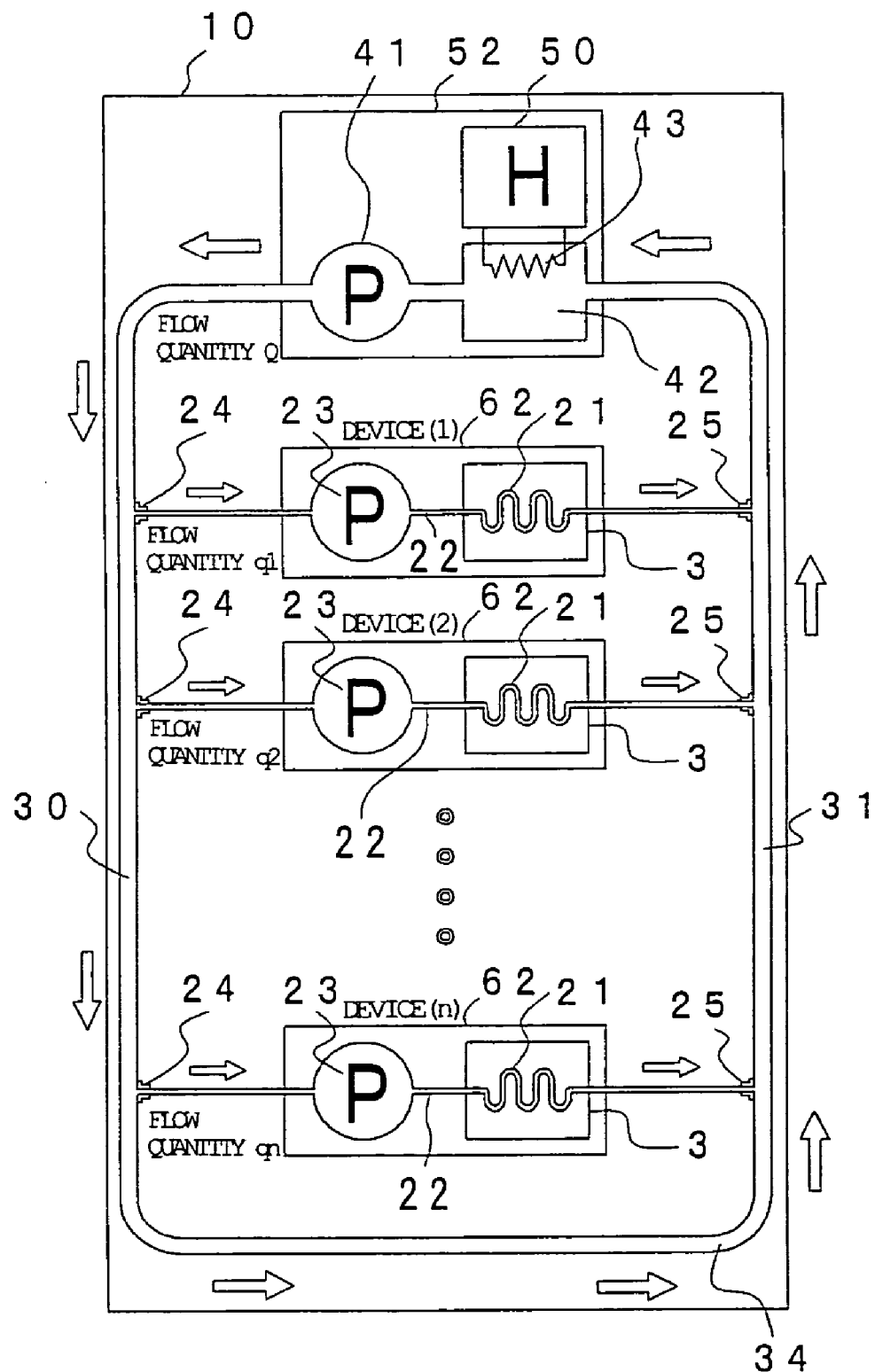
FIG. 4 is a schematic block diagram showing the system in which a bypass route is provided and a pump is mounted on each of the devices of the server modules.

First, examples of the configuration of the cooling system for the rack-mount server system according to an embodiment of the present invention will be described with reference to FIGS. 1 to 4. FIG. 1 shows the case where the bypass route is not provided, FIG. 2 shows the case where the bypass route is provided and a pump is not mounted on each device of the server module, FIG. 3 shows the case where the bypass route is provided and a flow control valve is provided in each device of the server module, and FIG. 4 shows the case where the bypass route is provided and the pump is mounted on each device of the server module.

The configuration of the cooling system for the rack-mount server system schematically shown in FIG. 1 does not have the bypass route and includes: a rack cabinet 10; a plurality of (1 to n) server modules 62 provided with a heat receiver 21, an internal pipe 22 in the device, and the like; a main circulation pipe 34 composed of a downstream pipe 30, an upstream pipe 31, and the like; and a cooling unit 52 provided with a main circulation pump 41, a tank 42, a cooling section 43, a heat exchanger 50, and the like.

As described above, in the case where the bypass route is not provided, the coolant is supplied to each of the devices of the server modules by means of the main circulation pump 41. In this case, the flow quantity of the coolant is evenly distributed to each of the devices when the flow path resistances are equal in each of the devices. Therefore, in the case where there is one device mounted thereon, the flow quantity Q (l/min) of the main circulation pump 41 is supplied to the device, and in the case where there are two devices mounted thereon, the flow quantity Q/2 (l/min) is supplied to each of the devices. In the case where there are n devices mounted thereon, the flow quantity Q/n (l/min) is supplied to each of the n devices. As described above, the flow quantity in the devices is changed depending on the number of mounted devices. The change in flow quantity causes the change in the heat quantity to be removed, and resulting in the change in the cooling performance.

Also, the flow path resistances are usually different in each of the devices of the server modules 62. In this case, when a several number of devices are mounted, a quantity of coolant inversely proportional to the flow path resistance flows in each of the server modules 62, and it becomes difficult to ensure the desired flow quantity for each of the devices.

Furthermore, the pressure in the pipe is also changed with the change in flow quantity. Since the diameter of the internal pipe 22 of the server module 62 is usually smaller than that of the main circulation pipe 34, the great deal of pressure is applied when the number of mounted devices is small, and there is the possibility that the coolant may leak from the joint portion. For its prevention, it is necessary to increase the diameter of the internal pipe 22 so as not to apply the great amount of pressure to the pipe. However, since the increase of the diameter requires a large volume, it is unfit for the device using the high-density mounting technology. Therefore, the configuration shown in FIG. 2 is created.

In the configuration of the cooling system for the rack-mount server system schematically shown in FIG. 2, the bypass route is provided and the pump is not provided in each of the devices of the server modules. The difference from the configuration in FIG. 1 is that the bypass route is provided to the main circulation pipe 34, and a bypass flow control valve 54 is connected to the bypass route.

In the case where the bypass route is provided and the pump is not provided in each of the devices of the server modules 62 as described above, it is possible to control the change in flow quantity in each device and the change in pressure in the pipes, which are caused by changing the number of mounted devices of the server modules 62.

Usually, since the main circulation pipe 34 has a relatively large diameter and the internal pipe 22 has a relatively small diameter, a large quantity of coolant flows in the bypass route with low flow resistance and only a small quantity of coolant flows in each of the devices. Therefore, just providing the bypass route is insufficient.

Accordingly, it is necessary to provide a bypass flow control valve 54 in the bypass route. The flow quantity in the devices is increased by reducing the flow quantity in the bypass route, and the flow quantity in the devices is reduced by increasing the flow quantity in the bypass route. The flow quantity and the pressure in the pipes can be adjusted in this manner. However, since the flow quantity of coolant is inversely proportional to the flow resistance of the path similar to the configuration shown in FIG. 1, it is difficult to ensure the desired flow quantity for each of the devices. Therefore, the configuration shown in FIG. 3 is created.

In the configuration of the cooling system for the rack-mount server system schematically shown in FIG. 3, the bypass route is provided and the flow control valve is provided in each of the devices of the server modules. The difference from the configurations in FIGS. 1 and 2 is that a device flow control valve 28 is connected to each of the internal pipes 22 of the server modules 62.

In the case where the bypass route is provided and the flow control valve 28 is provided in each of the devices of the server modules 62 as described above, the flow quantity through the device is reduced by closing the valve in the device, and the flow quantity through the device is increased by opening the valve in the device in each of the server modules 62. In this configuration, it is possible to achieve the desired flow quantity for each of the devices by the adjustment of the flow control valve 28 in each device together with the adjustment of the flow quantity and the pressure in the pipe by the bypass flow control valve 54. However, it is difficult to adjust the flow quantity to the desired value when a plurality of devices each having different flow quantities are mounted. Therefore, the configuration shown in FIG. 4 is created.

In the configuration of the cooling system for the rack-mount server system schematically shown in FIG. 4, the bypass route is provided and the pump is provided in each of the devices of the server modules. The difference from the configurations in FIGS. 1 to 3 is that an internal pump 23 is connected to each of the internal pipes 22 of the server modules 62.

In the case where the bypass route is provided and the pump is provided in each of the devices of the server modules 62 as described above, the relationship between the flow quantity (flow quantity of the main circulation pump 41) Q through the main circulation pipe 34 and the flow quantities (flow quantity of the internal pump 23 of each of the devices) q through each of the devices of the server modules 62 is set so as to satisfy the following condition:

$$Q > q1 + q2 + \ldots + qn \qquad \text{(Formula 1)}$$

By doing so, when the device is not mounted, the coolant flows through the bypass route of the main circulation pipe 34, and when the device is connected, the coolant flows through the device. However, most of the coolant flows through the bypass route with low flow resistance. For its prevention, the internal pump 23 is operated to supply and drain the coolant from and to the main circulation pipe 34 by itself, and the flow quantity more than necessary is sent to the bypass route.

Since this configuration enables the supply and drain by itself, it is possible to achieve the desired flow quantity in accordance with the performance of the internal pumps 23 for the devices of the server modules 62. In addition, when the condition in the above-described Formula 1 is satisfied, it is possible to pass the coolant with the desired flow quantity to each of the devices even in the case where a plurality of devices having different flow quantities are mounted, and thus, it is possible to ensure the stable cooling performance.

In the following description, the concrete example of the configuration will be described in detail with reference to FIG. 4. More specifically, the rack-mount server system shown in FIG. 4 includes: a rack cabinet 10; a plurality of server modules 62 provided with a heat receiver 21, an internal pipe 22 in the device, and the like; a main circulation pipe 34 composed of a downstream pipe 30, an upstream pipe 31, and the like; and a cooling unit 52 provided with a main circulation pump 41, a tank 42, a cooling section 43, a heat exchanger 50, and the like, and the rack-mount server system shown in FIG. 4 has a configuration as follows.

In the rack cabinet 10, the circulation system of the main circulation pipe 34 is formed in the mounting direction of the server modules 62, and the coolant is circulated by means of the main circulation pump 41. Furthermore, the heat of the coolant is radiated to the outside or the heat exchanger 50 cools the circulating coolant. This embodiment shows the cooling system in which the tank 42 is provided as a buffer of the main circulation system, the cooling section 43 is incorporated, and the heat exchanger is used to cool the coolant. Also, the main circulation pump 41, the tank 42, the cooling section 43, and the heat exchanger 50 are assembled together to form the cooling unit 52.

The server module 62 is a liquid-cooled type of data processing unit, in which the internal pump 23 is incorporated, the coolant is supplied through the internal pipe 23 to a heat-generating component 3, and the coolant is drained out to the outside after cooling the heat-generating component 3 by the heat receiver 21.

The main circulation pipe 34 is divided at the cooling section 43 into the downstream pipe 30 to which the coolant is drained and into the upstream pipe 31 from which the coolant is supplied. The coolant is supplied to the server module 62 from the downstream pipe 30 and drained to the upstream pipe 31. A plurality of server modules 62 are similarly connected to the main circulation pipe 34. In this case, it is necessary that the flow quantity Q through the main circulation pipe 34 is larger than the sum of the flow quantities q through each of the server modules 62.

Figure 5:
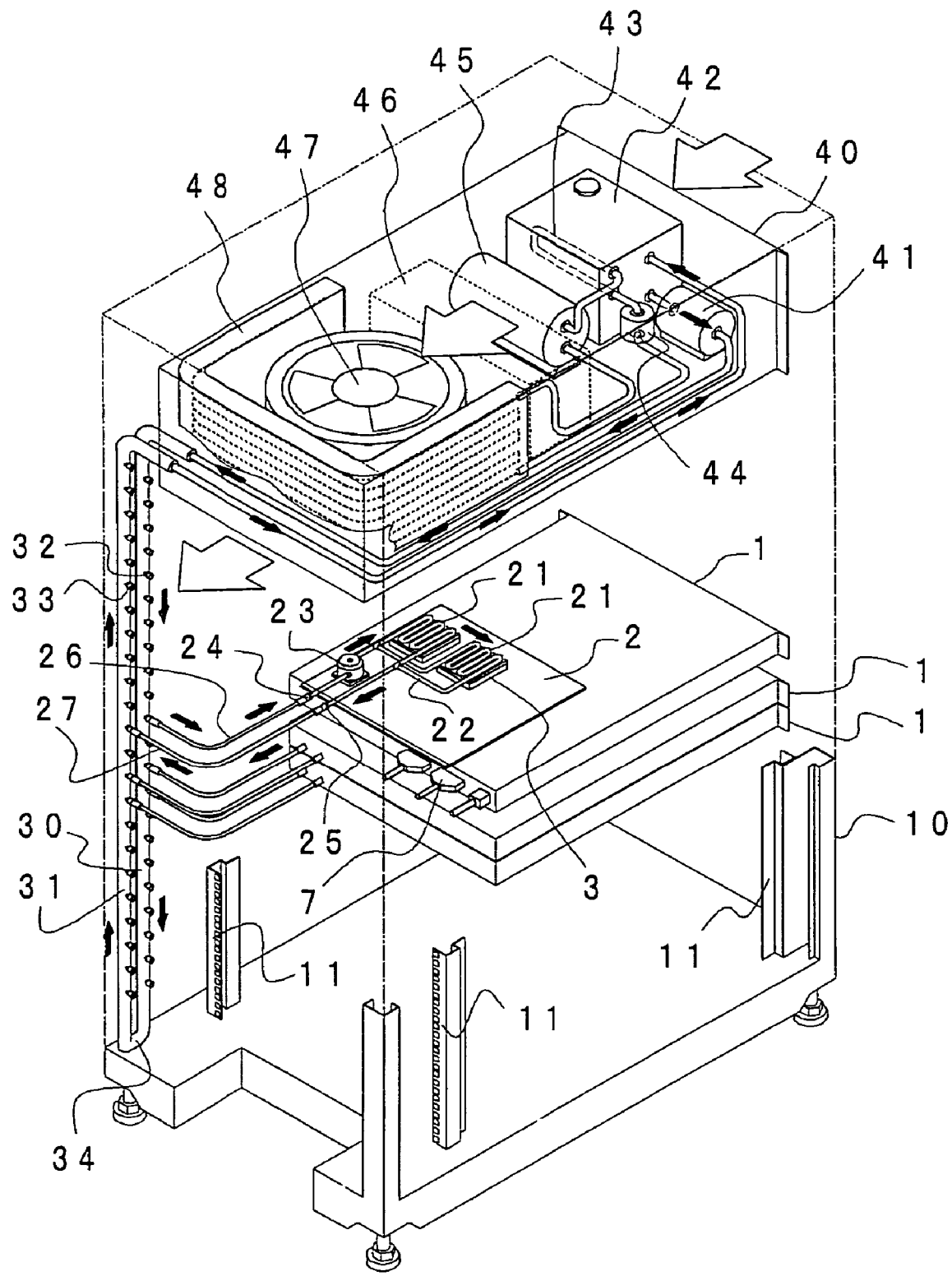
FIG. 5 is a perspective view showing the state of the system in which server modules are mounted in a rack cabinet.
Figure 6:
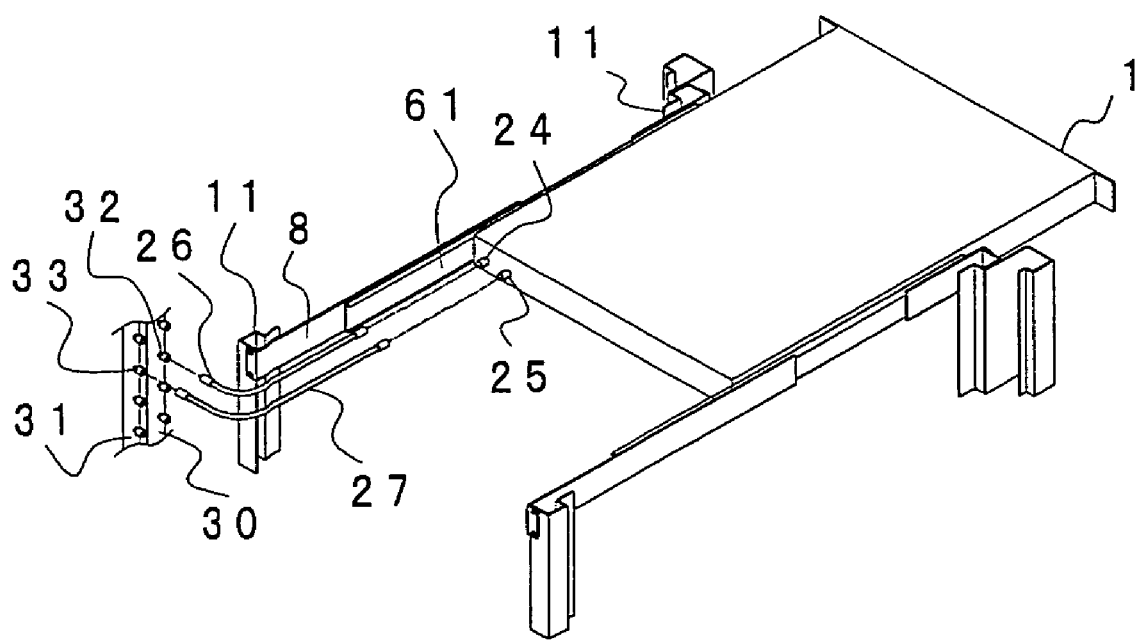
FIG. 6 is a perspective view showing the fluid connector of the server module.
Figure 7:
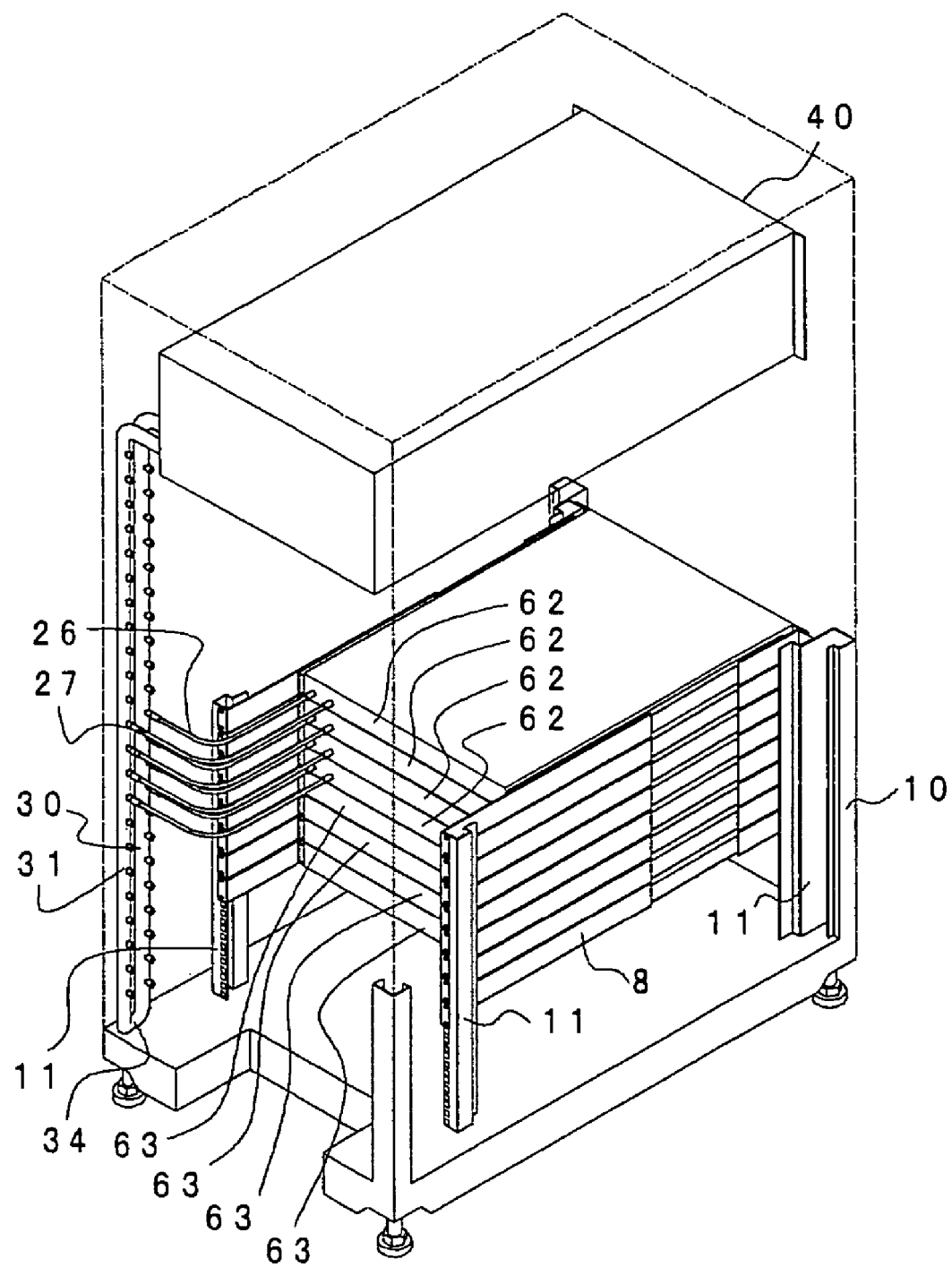
FIG. 7 is a perspective view showing the state where both the liquid-cooled server modules and the air-cooled server modules are mounted in the rack cabinet.

Next, a concrete example of the cooling system for the rack-mount server system according to the embodiment will be described with reference to FIGS. 5 to 7. FIG. 5 is a perspective view showing the state where the server modules are mounted in the rack cabinet, FIG. 6 is a perspective view showing the fluid connector of the server module, and FIG. 7 is a perspective view showing the state where both the liquid-cooled server modules and the air-cooled server modules are mounted in the rack cabinet.

The rack cabinet 10 has a box shape and is provided with four posts serving as mount angles 11 at the four corners thereof to which the server modules are attached. The main circulation pipe 34 is arranged vertically along the post forming the rack cabinet 10, and the coolant is circulated by the main circulation pump 41. The tank 42 is arranged as the buffer of the coolant in the upstream of the main circulation pump 41, and the main circulation pipe 34 is arranged outside the mount angles 11.

The heat exchanger 50 employs the system using a cooling medium, in which the evaporated cooling medium is compressed to high pressure in a compressor 45 and delivered to a radiator 48 for cooling medium, and then, cooled by a cooling fan 47 for cooling medium. This cooled cooling medium is liquidized and delivered to an expansion valve 44, in which the cooling medium is evaporated again to cool the cooling section 43, and then, returned to the compressor 45 again.

The cooling section 43 is incorporated in the tank 42 and cools the coolant in this tank 42. In addition, the cooling section 43 also has a function to detect the temperature of the circulating coolant and control the cooling power by using a cooling control circuit 46.

The main circulation pump 41, the tank 42, the cooling section 43, and the heat exchanger 50 are mounted in a cooling unit housing 40 and form the independent cooling unit 52.

The main circulation pipe 34 is divided at the cooling section 43 into the downstream pipe 30 from which the coolant is drained and the upstream pipe 31 to which the coolant is supplied, and they are arranged in parallel to each other. Downstream joints 32 are provided on the downstream pipe 30 and upstream joints 33 are provided on the upstream pipe 31 so that they are positioned at almost the same height. Furthermore, many pairs of the downstream joint 32 and the upstream joint 33 are arranged vertically.

These downstream joints 32 and upstream joints 33 have the automatic valve therein, and when the fluid joint is not connected, the valve is automatically closed to prevent the leakage of the liquid. More specifically, the joint with automatic valve has its valve in the connecting joints, and such a valve is formed in each of the male side and the female side of the joints. When the joints are connected, the valves are pushed to each other and the valves are opened, and when the joints are disconnected, the valves are closed by the spring force.

In the server module 62 according to the embodiment, a main board 2 is provided in the device housing 1 and heat-generating components 3 such as CPU and LSI are mounted on the main board 2. A supply joint 24 serving as a supply port of the coolant from outside is provided on the rear face of the device housing 1, and the internal pipe 22 is laid to the heat-generating components 3, for example, CPU and LSI. Furthermore, the heat receiver 21 for receiving the heat is provided, and the pipe is extended to a drain port to drain the heated coolant to the outside. A drain joint 25 is provided at the drain port.

Similar to the main circulation pipe 34, the supply joint 24 and the drain joint 25 are the joints with automatic valve. The heat receiver 21 is formed of the material with high heat conductivity and the meandering flow path is formed therein so as to make the contact area to the coolant as large as possible. The flow path is closely contacted to the heat-generating component 3. In addition, the internal pump 23 to deliver the coolant in the device is provided in the middle of the internal pipe 22.

As the connection method of the internal pipe 22 in the case of cooling a plurality of heat-generating components 3 in the server module 62, there are the serial connection and the parallel connection. However, in the case where the serial connection is used, the coolant is heated by the heat-generating components 3 on the upstream side and the cooling of the heat-generating components 3 on the downstream side is adversely affected. Therefore, the internal pipe 22 is connected to a plurality of heat-generating components 3 by using the parallel connection.

In this embodiment, the internal pump 23 provided in the middle of the internal pipe 22 is arranged on the upstream side of the heat-generating components 3 because the heated coolant is sent to the pump 23 and the lifetime and performance of the pump 23 are adversely affected when the pump is arranged on the downstream side of the heat-generating components 3.

Similar to the usual rack-mounted devices, the server module 62 is mounted on the mount angles 11 of the rack cabinet 10 via metal brackets 8, and the downstream joint 32 of the downstream pipe 30 and the supply joint 24 of the device are connected via a supply tube 26. Also, the upstream joint 33 of the upstream pipe 31 and the drain joint 25 of the device are connected via a drain tube 27. In addition, it is possible to connect a plurality of server modules 62 in the same manner.

As shown in FIG. 7, not only the liquid-cooled server modules 62 but also the usual air-cooled devices 63 can be mounted on the mount angles 11 of the rack cabinet 10 via the metal brackets 8. Therefore, it is possible to mount both the liquid-cooled server modules 62 and the air-cooled devices 63.

Subsequently, an example of the liquid cooling system used as the cooling system for the rack-mount server system will be described with reference to FIGS. 4 and 5.

The coolant is circulated through the main circulation pipe 34 by the main circulation pump 41 regardless of the connection of the server module 62. Also, the cold coolant is constantly supplied to the downstream pipe 30 by the cooling section 43 arranged on the upstream side of the main circulation pump 41. By detecting the temperature of the coolant and adjusting the power of the heat exchanger 50 in the cooling control circuit 46, the coolant with a constant temperature can be supplied to the downstream pipe 30.

The coolant flows in the server module 62 by connecting the server module 62 to the downstream pipe 30 and the upstream pipe 31 of the main circulation pipe 34. At this time, the server module 62 is connected after filling the coolant. Since the internal pump 23 is incorporated in the server module 62, the coolant is fed to the server module 62 by the operation of the internal pump 23 not by the operation of the main circulation pump 41.

In this manner, even in the case where a plurality of server modules 62 are connected, the flow quantity is controlled by the internal pump 23 so that the temperature of the heat-generating components 3 can be a uniform temperature, and a constant flow quantity of the coolant in accordance with the performance of the internal pump 23 can be supplied. However, it is necessary that the flow quantity through the main circulation pipe 34 is larger than the sum of the flow quantities through each of the server modules 62.

The coolant in the downstream pipe 30 of the main circulation pipe 34 is introduced into the device by the internal pump 23 incorporated in the server module 62, and the coolant reaches the heat-generating component 3 and receives its heat in the heat receiver 21 to cool the heat-generating component 3. Then, the coolant is heated and this heated coolant is drained to the upstream pipe 31 of the main circulation pipe 34.

Even when a plurality of server modules 62 are mounted, the supply ports are all connected to the downstream pipe 30 and the drain ports are all connected to the upstream pipe 31. Therefore, the coolant with the same temperature by the cooling section 43 is introduced into all of the devices. In addition, the heated coolant is brought together to the upstream pipe 31 and returned to the cooling portion 43, and then, cooled to a predetermined temperature again.

Figure 8:
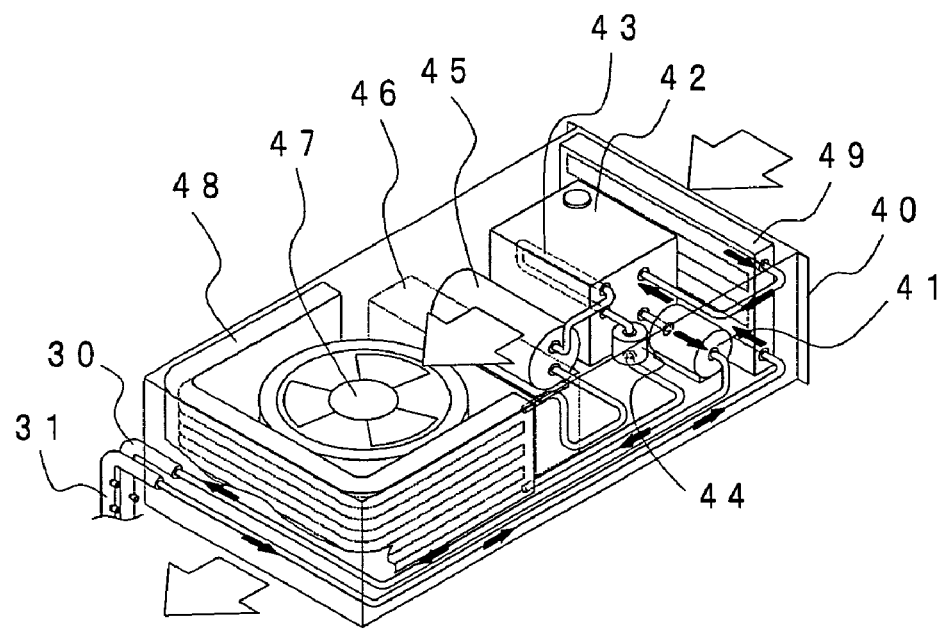
FIG. 8 is a perspective view showing an example of a cooling unit.

Next, an example of the configuration to improve the cooling efficiency in the cooling unit of the coolant according to the embodiment will be described with reference to FIG. 8. FIG. 8 is a perspective view showing another cooling unit.

A cooling fan 47 for cooling the cooling medium is provided in the cooling unit 52 of this configuration, in which the air is taken from the front face of the cooling unit housing 40 and delivered to the radiator 48 for cooling medium, and then, exhausted to the outside. The upstream pipe 31 is led into the cooling unit housing 40 and extended to the front face of the device, and then, led into a coolant radiator 49 provided in the air-intake section on the front face of the device. Thereafter, the pipe is led into the tank 42 which incorporates the cooling section 43 and extended to the downstream pipe 30 through the main circulation pump 41.

In this configuration, it is possible to reduce the temperature of the heated coolant passing through the upstream pipe 31 by the intake air of the cooling fan 47 for cooling medium in the coolant radiator 49 before the coolant is fed to the tank 42. By doing so, it is possible to reduce the amount of temperature to be reduced in the cooling section 43, and the load on the heat exchanger 50 can be reduced. Therefore, the coolant can be cooled efficiently.

Figure 9:
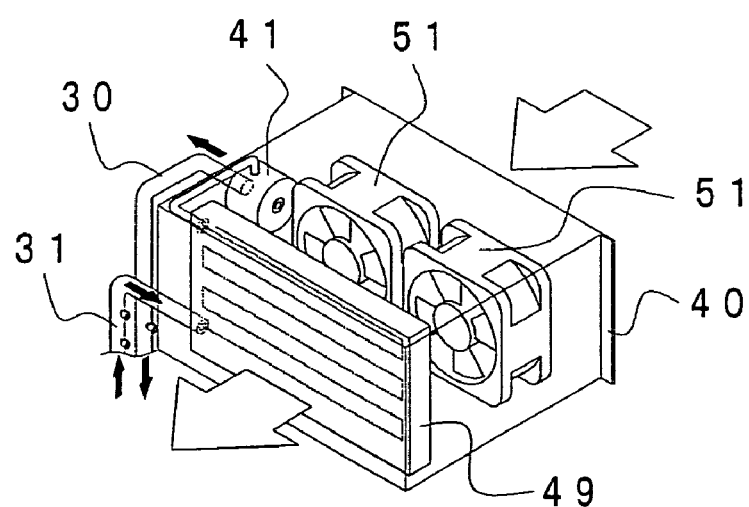
FIG. 9 is a perspective view showing another cooling unit in accordance with another system.

Furthermore, an example of the configuration of the cooling unit of the coolant in accordance with another system according to the embodiment will be described with reference to FIG. 9. FIG. 9 is a perspective view showing still another cooling unit in accordance with another system.

In the cooling unit 52 of this system, a coolant cooling fan 51 is arranged in the cooling unit housing 40 so that the air is delivered to the coolant radiator 49, and the upstream pipe 31 is led into the coolant radiator 49 and extended to the downstream pipe 30 via the main circulation pump 41.

In this configuration, the temperature of the heated coolant passing through the upstream pipe 31 can be reduced by the air delivered by the coolant cooling fan 51 in the coolant radiator 49. The simplified system as shown in FIG. 9 can also be used as the coolant cooling unit 52 in this embodiment.

Figure 10:
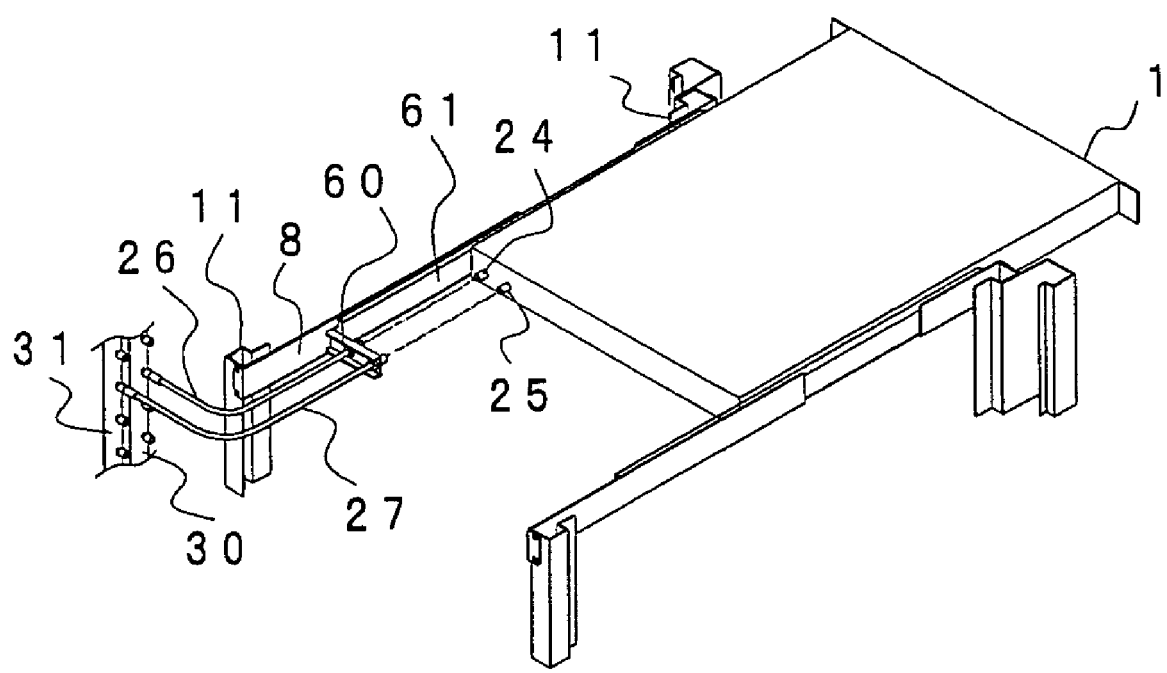
FIG. 10 is a perspective view showing another fluid connector of the server module.

Next, an example of another fluid connector of the server module according to the embodiment will be described with reference to FIG. 10. FIG. 10 is a perspective view showing another fluid connector of the server module.

The server module 62 with this fluid connector is mounted on the mount angles 11 via metal brackets 8 and slide rails 61 so that it can be pulled out to the front. The metal bracket 8 or the slide rail 61 is provided with a supply/drain tube holder 60 in parallel to the supply/drain face of the device, and one ends of the supply/drain tubes 26 and 27 are attached to the supply/drain tube holder 60 so that the supply/drain tubes 26 and 27 can be connected to the supply/drain joints 24 and 25 of the server module 62 when the server module 62 is installed into the rack cabinet 10. The other ends thereof are connected to the upstream/downstream pipes 30 and 31. These supply/drain joints 24 and 25 incorporate the automatic valves.

In this manner, the supply/drain joints 24 and 25 of the server module 62 are automatically connected to the upstream/downstream pipes 30 and 31 when the server module 62 is installed into the rack cabinet 10, and the supply/drain joints 24 and 25 are automatically disconnected from the upstream/downstream pipes 30 and 31 when the server module 62 is pulled out.

Figure 11:
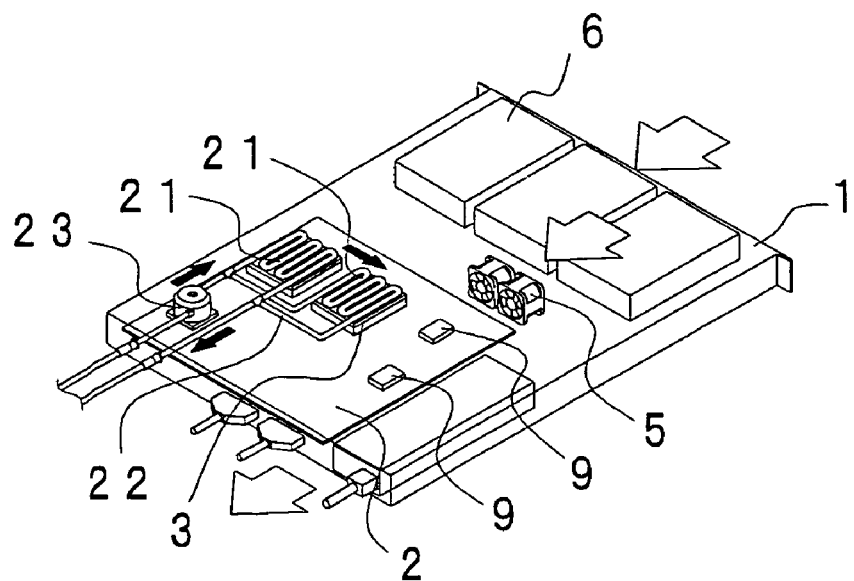
FIG. 11 is a perspective view showing the hybrid configuration of the server module.

Next, an example of the hybrid configuration of the server module according to the embodiment will be described with reference to FIG. 11. FIG. 11 is a perspective view showing the hybrid configuration of the server module.

In the server module 62 with this hybrid configuration, heat-generating components 3 with a high temperature such as CPU and LSI generating a relatively large amount of heat and other heat-generating portions 9 with a low temperature generating a relatively small amount of heat are mounted on the main substrate 2. The liquid cooling system in which the heat is received by the heat receiver 21 is used to cool the heat-generating components 3 with a high temperature, and the air cooling system in which the air is delivered by the cooling fan 5 mounted on the front face of the device of the server module 62 is used to cool the heat-generating portions 9 with a low temperature.

By doing so, in the server module 62 with this hybrid configuration in which the heat-generating components 3 with a high temperature and the heat-generating portions 9 with a low temperature are mounted, the liquid cooling system and the air cooling system are simultaneously used, and the heat-generating components 3 with a high temperature are cooled by the liquid cooling system and the heat-generating portions 9 with a low temperature are cooled by the air cooling system.

Figure 12:
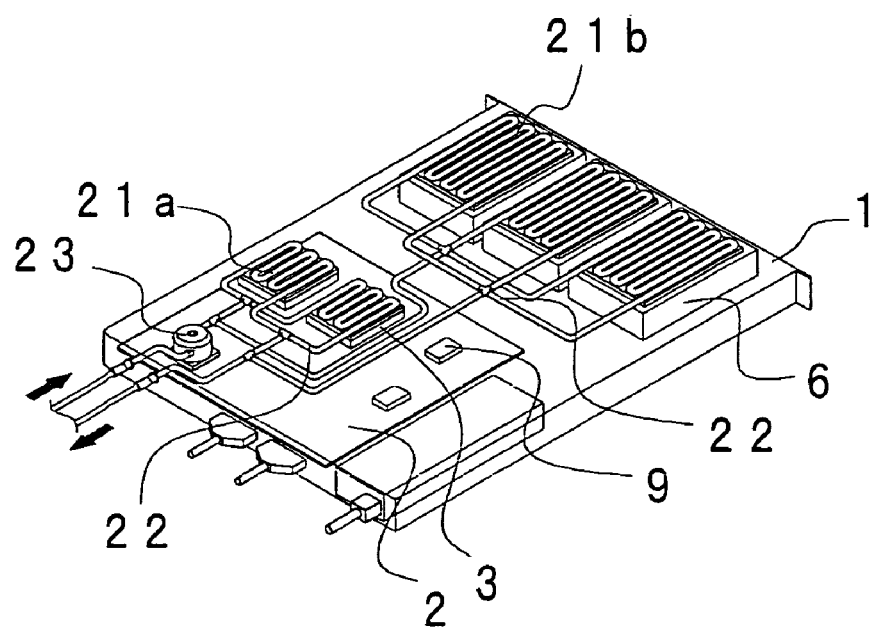
FIG. 12 is a perspective view showing the configuration in the case where a plurality of heat-generating parts of the server module are liquid-cooled.

Furthermore, an example of the configuration in which a plurality of heat-generating parts are liquid-cooled in the server module according to the embodiment will be described with reference to FIG. 12. FIG. 12 is a perspective view showing the configuration in which a plurality of heat-generating parts of the server module are liquid-cooled.

In the server module 62 with this configuration, the heat-generating components 3 with a high temperature generating a relatively large amount of heat and other heat-generating portions 9 with a low temperature generating a relatively small amount of heat are mounted on the main substrate 2. In addition, heat-generating portions of devices 6 such as magnetic storage devices generating a relatively large amount of heat are mounted on the front face of the device of the server module 62. In this configuration, similar to the heat-generating components 3 whose heat is received by the heat receivers 21a, the heat-generating portions of the devices 6 are also cooled by circulating the coolant through the internal pipes 22 connected in parallel and receiving its heat in the heat receivers 21b. More specifically, it is possible to cool a plurality of heat-generating parts by the liquid cooling system.

Since the internal pipe 22 is laid in parallel to the heat-generating components 3 and the heat-generating portions of the devices 6, it is possible to supply the coolant with the same temperature to each of the heat-generating parts. In addition, the serial connection is also applicable to the parts in which the amount of heat generation is small. Furthermore, in the case where the heat in the heat-generating portions 9 can be cooled by the natural air cooling, the cooling fan as shown in FIG. 12 is unnecessary.

Figure 13:
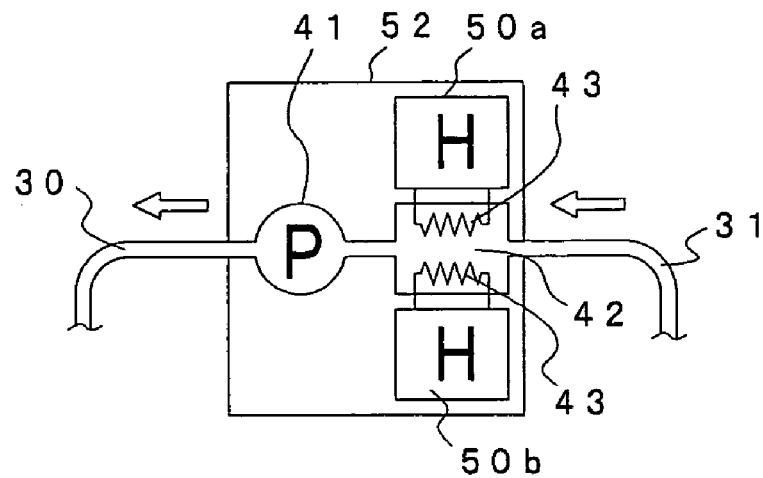
FIG. 13 is a schematic block diagram showing the case where the redundancy for the heat exchanger of the cooling unit is provided.

Next, an example of the configuration in which the redundancy for the heat exchanger is formed in the cooling unit according to the embodiment will be described with reference to FIG. 13. FIG. 13 is a schematic block diagram showing the case where the redundancy for the heat exchanger of the cooling unit is provided.

In the cooling unit 52 with this configuration, the two cooling sections 43 are incorporated in the tank 42 and the two heat exchangers 50a and 50b to cool each of the cooling sections 43 are provided in parallel so that they are operated independently. In this configuration, the coolant can be cooled by the two heat exchanges 50a and 50b and the coolant can be cooled even when either of the heat exchangers does not work. Alternatively, it is also preferable that only one of the two exchangers is operated and the other exchanger is operated when the exchanger is broken.

Figure 14:
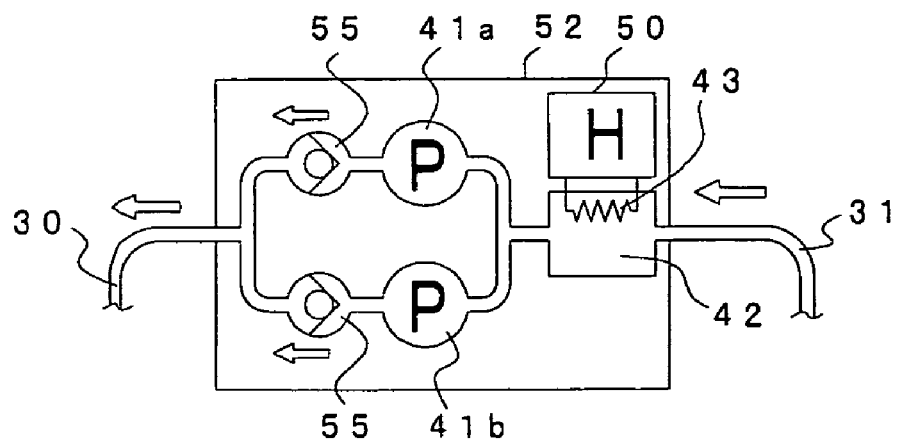
FIG. 14 is a schematic block diagram showing the case where the redundancy for the main circulation pump of the cooling unit is provided.
Figure 15:
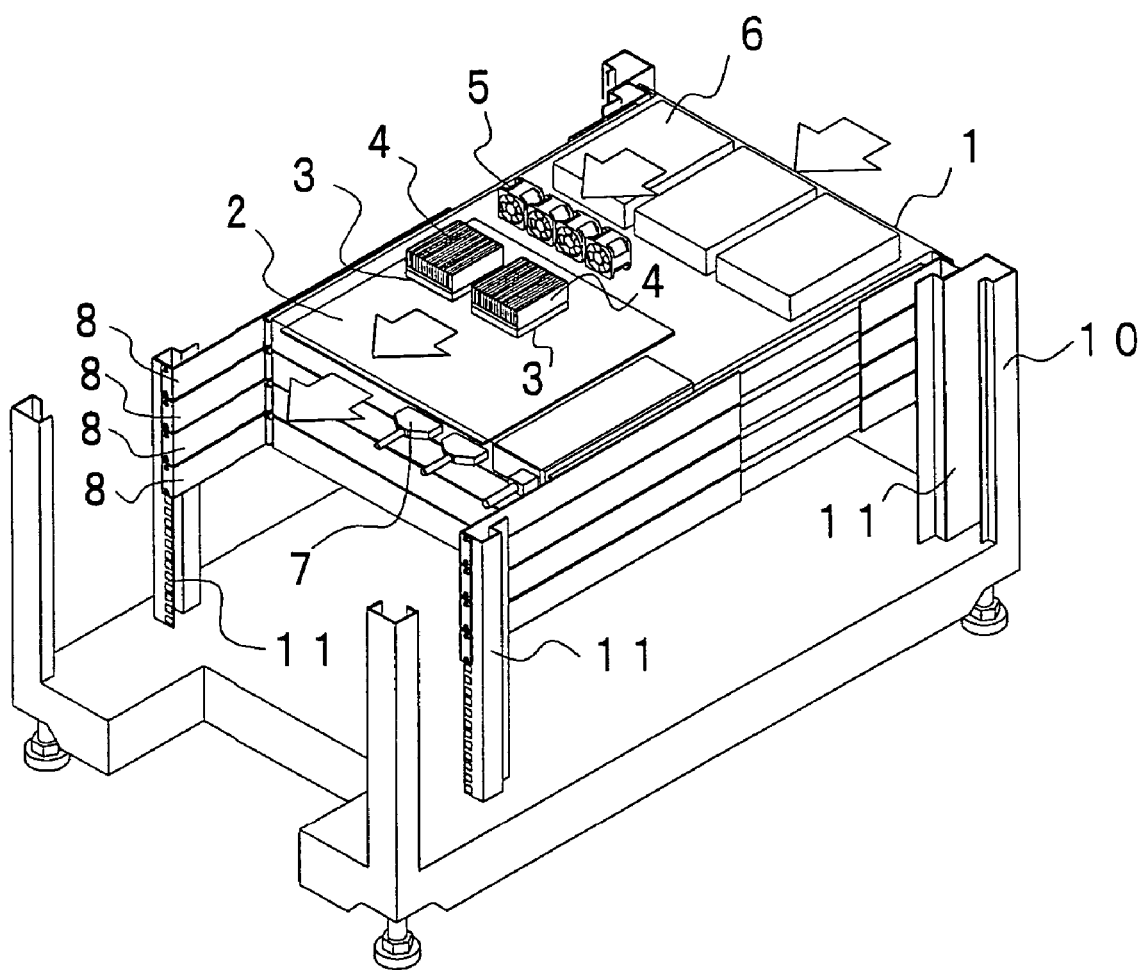
FIG. 15 is a perspective view showing the state where the server modules are mounted in the rack cabinet of the conventional forced air cooling system.

Furthermore, an example of the configuration in which the redundancy for the main circulation pump is provided in the cooling unit according to the embodiment will be described with reference to FIG. 14. FIG. 14 is a schematic block diagram showing the case where the redundancy for the main circulation pump of the cooling unit is provided.

In the cooling unit 52 with this configuration, internal pipes are connected in parallel at an outlet of the tank 42, and two main circulation pumps 41a and 41b for circulating the coolant in the internal pipes are provided in parallel so that they are operated independently. In addition, a check valve 55 is attached to each of the main circulation pumps 41a and 41b. In this configuration, the coolant is circulated by the two main circulation pumps 41a and 41b, and the coolant can be circulated even when either of the main circulation pumps does not work. Also, since the check valve 55 is attached to each of the main circulation pumps 41a and 41b, the circulation of the coolant in the pumps caused when one of the main circulation pumps 41a and 41b is broken can be prevented even when the main circulation pumps 41a and 41b are connected in parallel.

As described above, the effects as follows can be achieved by the cooling system for the rack-mount server system according to the embodiments.

(1) Even under the condition that the cooling by the cooling fan cannot be sufficiently performed due to the reduction of the intake and exhaust areas caused by the device thickness reduction and the increase of the pressure loss of the fluid caused by the high density mounting in the rack-mounted device using the forced air cooling, the adoption of the liquid cooling system makes it possible to receive the heat of the heat-generating components 3 with a high temperature by the coolant and to radiate the heat to the outside of the device of the server module 62, and also, the coolant can be smoothly cooled in the cooling unit 52 mounted in the rack cabinet 10.

(2) Since the coolant is circulated by the main circulation pump 41 provided in the main circulation pipe 34 and the server module 62 to be mounted is provided with the internal pump 23 to circulate the coolant in the devices thereof, even in the case where the number of server modules to be mounted (connected) is increased, the flow quantity of the coolant passing through each of the devices can be kept uniform as long as the flow quantity through the main circulation pipe 34 is larger than the sum of the flow quantities through the mounted devices.

(3) By controlling the cooling power to the coolant in the heat exchanger 50 with the control circuit, it becomes possible to supply the coolant with a constant temperature to each of the server modules 62, and therefore, it is possible to provide the highly reliable cooling performance.

(4) Since it is necessary to connect the server module 62 to the main circulation pipe 34 of the cooling unit 52 mounted in the rack cabinet 10 only when the liquid-cooled server modules 62 are mounted, it is also possible to mount the air-cooled device 63 as well as the liquid-cooled devices. In addition, since the joint with automatic valve is used in the fluid connector, it is possible to easily mount and detach the devices of the server modules 62. Furthermore, since a plurality of joints are provided in the main circulation pipe 34, it is possible to mount the server module 62 at the desired position. The system configuration capable of mounting various devices other than the liquid-cooled devices can be provided without losing the advantages of the rack-mount system.

(5) Since only the heat receiver 21, the internal pump 23, and the internal pipe 22 are required to form the cooling configuration in the server module 62, it is possible to simplify the configuration for cooling the devices. Furthermore, the simplification of the cooling configuration leads to the size reduction of the server module 62.

(6) Since it is possible to form the closed cooling unit 52 within the rack cabinet 10, the heat-generating components 3 with a high temperature in the devices of the server module 62 can be cooled without such a special condition that the room temperature is extremely reduced.

(7) Since the coolant cooling unit 52 is assembled as a rack-mounted device and the cooling unit 52 is formed so that it can be mounted on the widely-prevalent rack cabinet 10, the cooling system according to the present invention can be easily introduced without preparing any special rack cabinet 10.

(8) By providing a plurality of heat exchangers 50 or a plurality of main circulation pumps 41 in parallel, the cooling unit 52 can be operated independently. Therefore, the redundancy configuration can be provided in which, when one exchanger or one main circulation pump is broken, the other exchanger or the other main circulation pump is operated.

According to the present invention, even in the case where the performance of the server module is advanced, the thickness of the server module is reduced, and the high density mounting technology is advanced, the cooling enough to ensure the reliability of the server modules mounted in the rack cabinet can be achieved without losing the advantages of the rack-mount system. In addition, it is also possible to achieve the smooth heat radiation from the high-temperature components mounted on the server module particularly by adopting the liquid cooling system.

Also, according to the present invention, since the advantages of the rack-mount system are not lost, it is possible to form the rack-mount server system in which the easiness of mounting and the operationality inherent in the conventional devices other than the liquid-cooled device are not impaired.

Furthermore, according to the present invention, the closed cooling unit is formed within the rack cabinet, and the cooling configuration for each of the server modules can be simplified. Therefore, it is possible to achieve the size reduction of the server module and the size reduction of the rack-mount server system.

What is claimed is:

1. A rack-mount server system, comprising:
a plurality of server modules with heat-generating components, said heat-generating components being cooled by a circulating liquid coolant;
a liquid coolant circulation path to which said server modules are connected in parallel and through which the liquid coolant to cool the server modules is circulated; and
a cooling unit connected in the middle of said liquid coolant circulation path, said cooling unit circulating the liquid coolant and cooling said liquid coolant by radiating its heat to the outside air.

2. The rack-mount server system according to claim 1, wherein said liquid coolant circulation path has a bypass route parallel to said server modules and going around said server modules.

3. The rack-mount server system according to claim 2, wherein said liquid coolant circulation path has flow quantity control means in said bypass route to control the flow quantity of the liquid coolant circulating in said server modules.

4. The rack-mount server system according to claim 3, wherein said flow quantity control means increases the flow quantity through said flow quantity control means when reducing a flow quantity of the liquid coolant to the server modules, and
wherein said flow quantity control means reduces the flow quantity through said flow quantity control means when increasing the flow quantity of the liquid coolant to the server modules.

5. The rack-mount server system according to claim 2, wherein said server module has flow quantity control means in a flow path connected to said liquid coolant circulation path.

6. The rack-mount server system according to claim 5, wherein said flow quantity control means is provided on an inflow side of the liquid coolant circulating in the server module.

7. The rack-mount server system according to claim 2, wherein the flow quantity of the liquid coolant through the bypass route of said liquid coolant circulation path is controlled to change the flow quantity of the liquid coolant circulating in said plurality of server modules.

8. The rack-mount server system according to claim 1, wherein each of the server modules has flow quantity control means of the liquid coolant in a part of the liquid coolant circulation path to cool the server modules.

9. The rack-mount server system according to claim 8, wherein said flow quantity control means is provided on an inflow side of the liquid coolant circulating in the server module.

10. The rack-mount server system according to claim 1, wherein joints with automatic valve are provided, with which an inlet and an outlet of the liquid coolant circulating in said server modules to cool the heat-generating components are connected to said liquid coolant circulation path.

11. The rack-mount server system according to claim 10, wherein said joints with automatic valve are arranged in accordance with mount pitch of the server modules to be mounted in the rack-mount server system.

12. The rack-mount server system according to claim 10, wherein said joints with automatic valve are provided on a rear surface of the server module so that a connecting direction of the joints corresponds to a mounting direction of the server module.

13. The rack-mount server system according to claim 1 wherein said cooling unit measures the temperature of the liquid coolant discharged to said liquid coolant circulation path and cools the liquid coolant discharged to said liquid coolant circulation path to a predetermined temperature, and
the server module controls the flow quantity of the liquid coolant supplied from said liquid coolant circulation path so that the temperature of the heat-generating components cooled by circulating the liquid coolant reaches a predetermined temperature.

14. The rack-mount server system according to claim 1, wherein said cooling unit is provided at the top of the rack cabinet of the rack-mount server system.

15. The rack-mount server system according to claim 1, wherein the flow quantity of the liquid coolant discharged from said cooling unit to said liquid coolant circulation path is larger than the sum of the flow quantities of the liquid coolant circulating in the plurality of server modules connected to said liquid coolant circulation path.

16. A rack cabinet of a rack-mount server system in which a plurality of server modules having heat-generating components such as CPU are mounted, comprising:
- a liquid coolant circulation path to which said server modules are connected in parallel via joints and through which a liquid coolant to cool the server modules is circulated; and
- a cooling unit connected in the middle of said liquid coolant circulation path, said cooling unit circulating the liquid coolant and cooling said liquid coolant by radiating its heat to the outside air.

17. The rack cabinet according to claim 16, wherein said liquid coolant circulation path is arranged vertically along the cabinet, and said liquid coolant circulation path is arranged on the side of a cable space of the mounted server module.

18. The rack cabinet according to claim 16, wherein said cooling unit is provided at the top of the rack cabinet.

19. The rack cabinet according to claim 16, wherein said cooling unit includes a refrigerating unit 10 radiate the heat generated in the server module and absorbed in the liquid coolant to the outside air.

20. The rack cabinet according to claim 19, wherein a radiator of said refrigerating unit is cooled by the cooling air flowing in a direction from a front side to a rear side of the cabinet.

21. The rack cabinet according to claim 19, wherein said joints are arranged in accordance with mount pitch of the server modules mounted in the rack cabinet.

22. The rack cabinet according to claim 16, wherein said joints are provided so that the connecting/disconnecting direction of said joints corresponds to the mounting direction of the server module.

23. The rack cabinet according to claim 22, wherein said joint includes an automatic valve.

24. A server module with a heat-generating component such as CPU in a rack-mount server system, comprising;
- a first heat-generating component cooled by a liquid coolant supplied from a cooling unit of a rack cabinet; and
- a second heat-generating component cooled by cooling air passing through the server module,
- wherein said second heat-generating component is arranged in a front part of the module from which the outside air is delivered, and
- said first heat-generating component is arranged in a rear part of the module to and from which said liquid coolant is supplied and drained.

25. A server module with a heat-generating component such as CPU in a rack-mount server system, comprising;
- a first heat-generating component cooled by a liquid coolant supplied from a cooling unit of a rack cabinet; and
- a second heat-generating component cooled by cooling air passing through the server module,
- wherein said server module further comprises: joints directed in a mounting direction of the server module, through which the liquid coolant to cool said first heat-generating component is supplied and discharged.

26. The server module according to claim 25, wherein said joints include automatic valves.

27. A server module with a heat-generating component such as CPU in a rack-mount server system, comprising:
- a first heat-generating component cooled by a liquid coolant supplied from a cooling unit of a rack cabinet;
- a second hear-generating component cooled by cooling air passing through the server module,
- wherein flow quantity control means to control the flow quantity of the liquid coolant to cool said first heat-generating component is provided on an inflow side of said liquid coolant.

28. The server module according to claim 27, wherein said flow quantity control means controls the flow quantity so that the temperature of said first heat-generating component reaches a predetermined temperature.

* * * * *